(12) United States Patent
Thorgrimsson (10) Patent No.: US 7,680,559 B2
(45) Date of Patent: Mar. 16, 2010

(54) WAFER MOVEMENT CONTROL MACROS

(75) Inventor: Christopher Fryer Thorgrimsson, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1057 days.

(21) Appl. No.: 11/054,143

(22) Filed: Feb. 8, 2005

(65) Prior Publication Data

US 2006/0178772 A1    Aug. 10, 2006

(51) Int. Cl.
*G06F 7/00* (2006.01)
(52) U.S. Cl. ..................................... 700/213
(58) Field of Classification Search .......... 700/213, 700/245, 121
See application file for complete search history.

(56) References Cited

U.S. PATENT DOCUMENTS

| | | | |
|---|---|---|---|
| 5,875,286 A * | 2/1999 | Bernstein et al. | 700/247 |
| 2002/0016647 A1 * | 2/2002 | Bourne et al. | 700/165 |
| 2002/0098713 A1 * | 7/2002 | Henley et al. | 438/776 |
| 2002/0120401 A1 * | 8/2002 | Macdonald et al. | 702/6 |
| 2003/0149717 A1 * | 8/2003 | Heinzman | 709/101 |

OTHER PUBLICATIONS

"International Preliminary Report on Patentability", Issued in PCT Application No. PCT/US2006/004625; Mailing Date: Apr. 2, 2009.

* cited by examiner

*Primary Examiner*—Gene Crawford
*Assistant Examiner*—Ramya Prakasam
(74) *Attorney, Agent, or Firm*—IP Strategy Group, P.C.

(57) ABSTRACT

A computer-implemented method for creating a set of wafer transfer instructions configured to transfer a wafer between an origination wafer-holding location and a destination wafer-holding location in a plasma cluster tool, which has a plurality of wafer-holding locations. The method includes receiving a first user-provided location indicator and a second user-provided location indicator, which graphically identify the origination wafer-holding location and the destination wafer-holding location respectively on the on-screen graphical representation of the plasma cluster tool. The method further includes ascertaining data pertaining to a path between the first user-provided location indicator and the second user-provided location indicator. The method further includes forming the set of wafer transfer instructions responsive to the data pertaining to the path. The set of wafer transfer instructions is configured to transfer the wafer along a set of wafer-holding locations associated with the path.

17 Claims, 9 Drawing Sheets

Drag-and-Drop Overview

WAFER MOVEMENT CONTROL MACROS

BACKGROUND OF THE INVENTION

Controlling the transfer of a wafer within a plasma cluster tool environment can be a complex and tedious process. As discussed herein, a plasma cluster tool relates to an integrated multi-module plasma processing system. Generally, a wafer undergoes a series of process steps in various wafer-holding locations by the time the wafer completes an etching cycle.

As discussed herein, a wafer-holding location relates to a given node within a given module. Examples of modules include, but are not limited to, process modules, airlock modules, vacuum transfer modules, atmospheric transfer modules, and ports. Each module may have a plurality of nodes (i.e., slots), from one to an $n^{th}$ number of nodes. For example, a process module usually has one node while an airlock module generally has two nodes. Thus, an example of a wafer-holding location is node 1 of airlock module 1.

The transfer of a wafer between wafer-holding locations is usually handled by a centralized handling module. A user at the centralized handling module creates wafer transfer instructions (i.e., macro commands or sequences) that may involve a combination of menus, buttons and icons to enable wafer movement. Further, to move a wafer from an origination wafer-holding location (i.e., source module with source node) to a destination wafer-holding location may involve multiple intermediate wafer transfer instructions. Thus, a successful wafer movement may be dependent upon skills and reliability of the user. However, even if the user is skilled in the creation of wafer transfer instructions, the sheer number of parameters that the user may have to provide to complete a wafer movement increases the likelihood that an error may occur.

Figure 1:
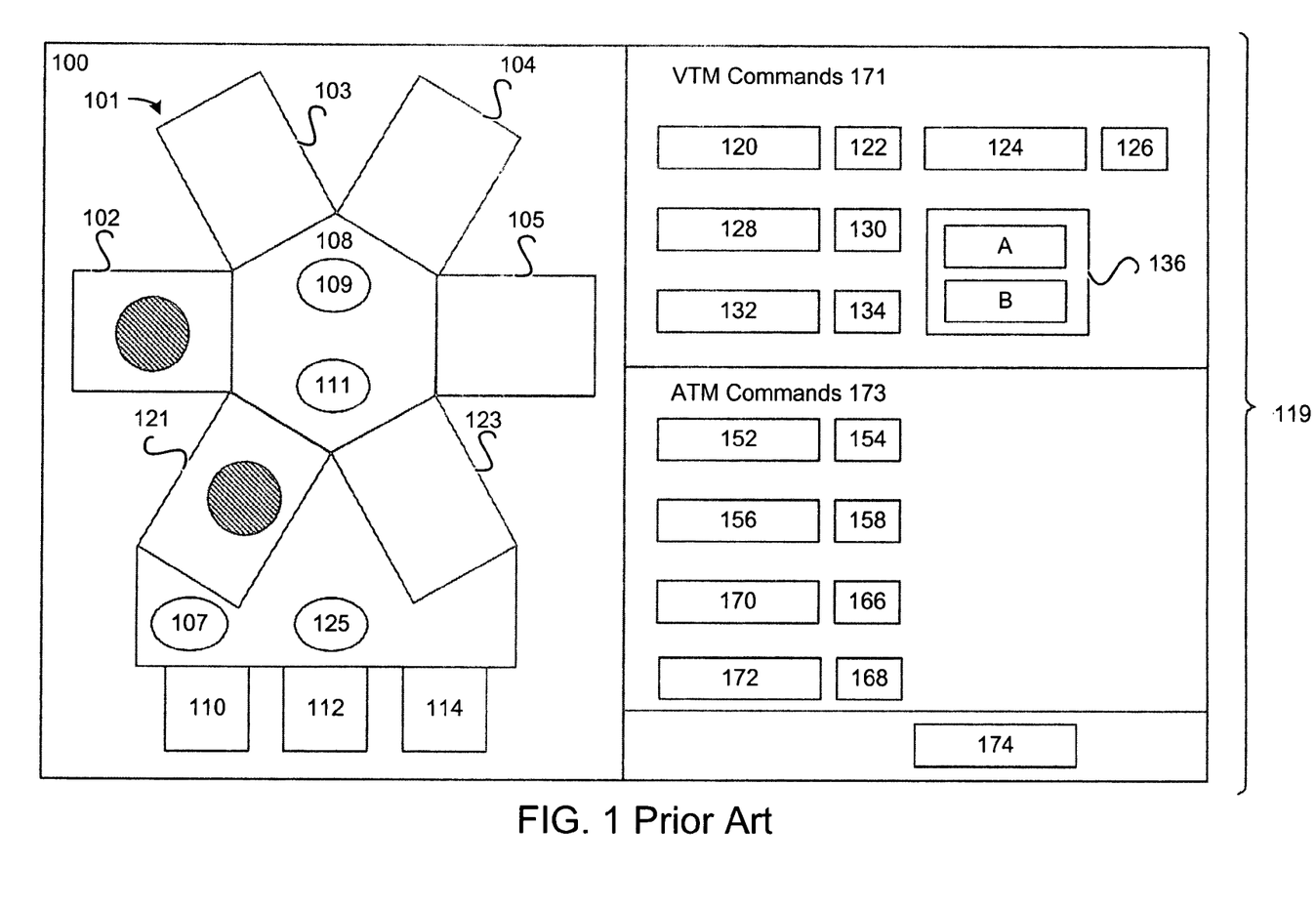
FIG. 1 shows a menu-driven interface, which is coupled with a graphical animated overview of the current state of a plasma cluster tool.

To facilitate discussion and to illustrate the possible complexity of creating and executing wafer transfer instructions, FIG. 1 shows a menu-driven interface, which is coupled with a graphical animated overview of the current state of a plasma cluster tool. Section 100 shows an animated graphical overview of the current state of plasma cluster tool 101. Section 119 shows a menu driven interface that user employs to create wafer transfer instructions to move wafers within plasma cluster tool 101. Plasma cluster tool 101 generally consists of various wafer-holding locations that enable a wafer to be processed as it moves from a port through an atmospheric transfer module (ATM) to a vacuum transfer module (VTM) to one or more process modules and ultimately back out to a port.

A wafer is placed in one of the ports (110, 112, 114). An ATM 125, which may be a robotic arm, moves the wafer to an aligner 107. Aligner 107 allows the wafer to be centered properly before the wafer is etched. Once centered, the wafer is moved by ATM 125 to one of the airlock modules (121 and 123). Since airlock modules have the ability to match the environment between an atmospheric transfer module and a vacuum transfer module, the wafer is able to move between the two pressure environments without being damaged.

From an airlock module, the wafer is moved into one of the process modules (102, 103, 104 and 105) by one of the robotic effectors (109 and 111) in vacuum transfer module (VTM) 108. To move between process modules, one of the robotic effectors in VTM 108 is used. For example, to move from process module (PM) 102 to PM 104, the wafer is moved from PM 102 to VTM 108. From VTM 108, the wafer is moved to PM 104.

Once the wafer has been processed, the wafer is moved from the process modules (102 and 104) to one of the airlock modules (121 and 123) by one of the robotic effectors (109 and 111) in VTM 108. At the airlock module (i.e., 123), the wafer may be moved via ATM 125 to one of the ports (110, 112, 114) or to aligner 107.

With the aid of the graphical animated overview in section 100, a user is able to employs section 119 to create wafer transfer instructions. Section 119 is divided into 2 main sections: VTM commands 171 and ATM commands 173. Assuming that a wafer is in PM 102, the user wants to move the wafer to port 110. To create wafer transfer instructions to execute the wafer movement for the example mentioned above, the user has to create two different sets of wafer transfer instructions. The set of first wafer transfer instructions, which are defined in VTM commands 171, move the wafer from PM 102 to one of the airlock modules. The second set of wafer transfer instructions, which are defined in ATM commands 173, move the wafer from one of the airlock modules to port 110.

To create the set of first wafer transfer instructions, the user identifies an origination wafer-holding location, an intermediate destination wafer-holding location, and a robotic effector that will move the wafer from the origination wafer-holding location to the intermediate destination wafer-holding location. First, at fields 120 and 122 the user has to identify a module and node respectively for the origination wafer-holding location (i.e., node 1 of PM 102).

Then the user has to define the intermediate destination wafer-holding location. The intermediate destination wafer-holding location may be another PM (PM 104, PM 103, or PM 105) or it may be one of the airlock modules (121 or 123). For example, the parameters for fields 124 and 126 may be node 1 of airlock module 123. Finally, to complete VTM commands 171, the user has to identify at field 136 which robotic effector (i.e., 109) in VTM 108 to use.

To move the wafer to its final destination wafer-holding location at port 110, the user identifies an intermediate origination wafer-holding location and a destination wafer-holding location at ATM commands 173. First, at fields 152 and 154, the user identifies the module and node respectively for the intermediate origination wafer-holding location (i.e., node 1 of airlock module 123). The intermediate origination wafer-holding location defined in ATM commands 173 may the same intermediate destination wafer-holding location identified in VTM commands 171. Then the user identifies the destination wafer-holding location parameters for fields 156 and 158 (i.e., node 1 of port 110). To execute the command, the user pushes button 174.

The example above describes a transfer of a wafer from a module to a port. However, wafer movement is bi-directional. For example, a wafer at port 110 needs to be moved to PM 102 to be processed. In this situation, a user has to first create wafer transfer instructions in ATM commands 173 to move the wafer from the port through the ATM. Then the user creates wafer transfer instructions in VTM commands 171 to move the wafer to the designated process module.

In another example, a user may only want to move a wafer to an intermediate wafer-holding location. For example, the user wants to move the wafer at PM 102 to VTM 108. To accomplish this transfer, the user may use a "Pick" option, which requires the user to identify an origination wafer-holding location in fields 132 and 134 (module and node respectively) and to determine a robot effector in field 136.

Likewise, if the user wants to move the wafer from VTM 108 to PM 102, then the user may use a "Place" option, which requires the user to identify a destination wafer-holding location in fields 128 and 130 (module and node respectively) and to determine a robot effector in field 136. A similar "Pick" (fields 172 and 168) and "Place" (fields 170 and 166) options exist in ATM commands 173.

Figure 2A:
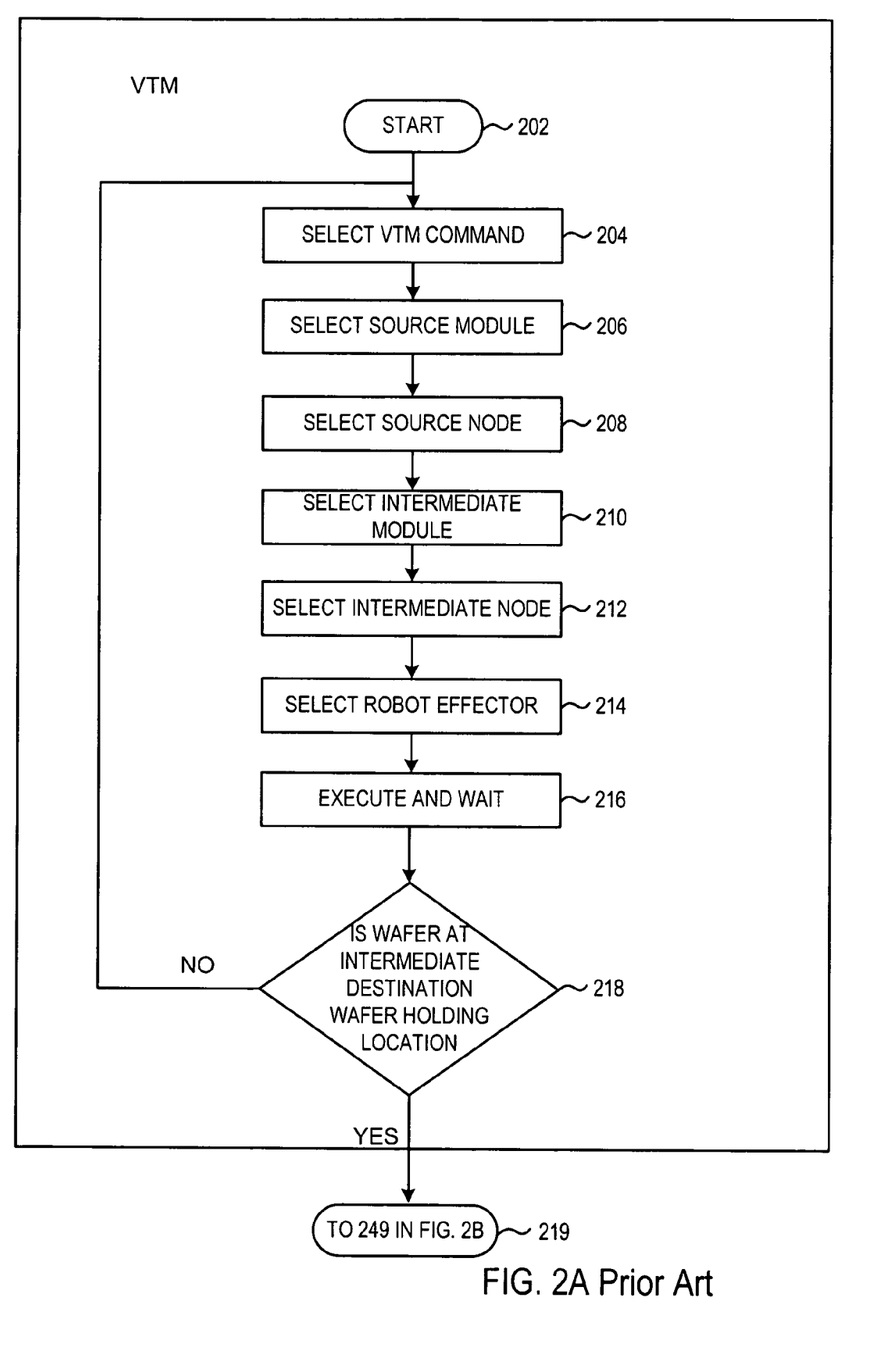
FIG. 2A shows a flowchart of the steps a user may take in order to move a wafer to a desired wafer-holding location in a vacuum transfer module.
Figure 2B:
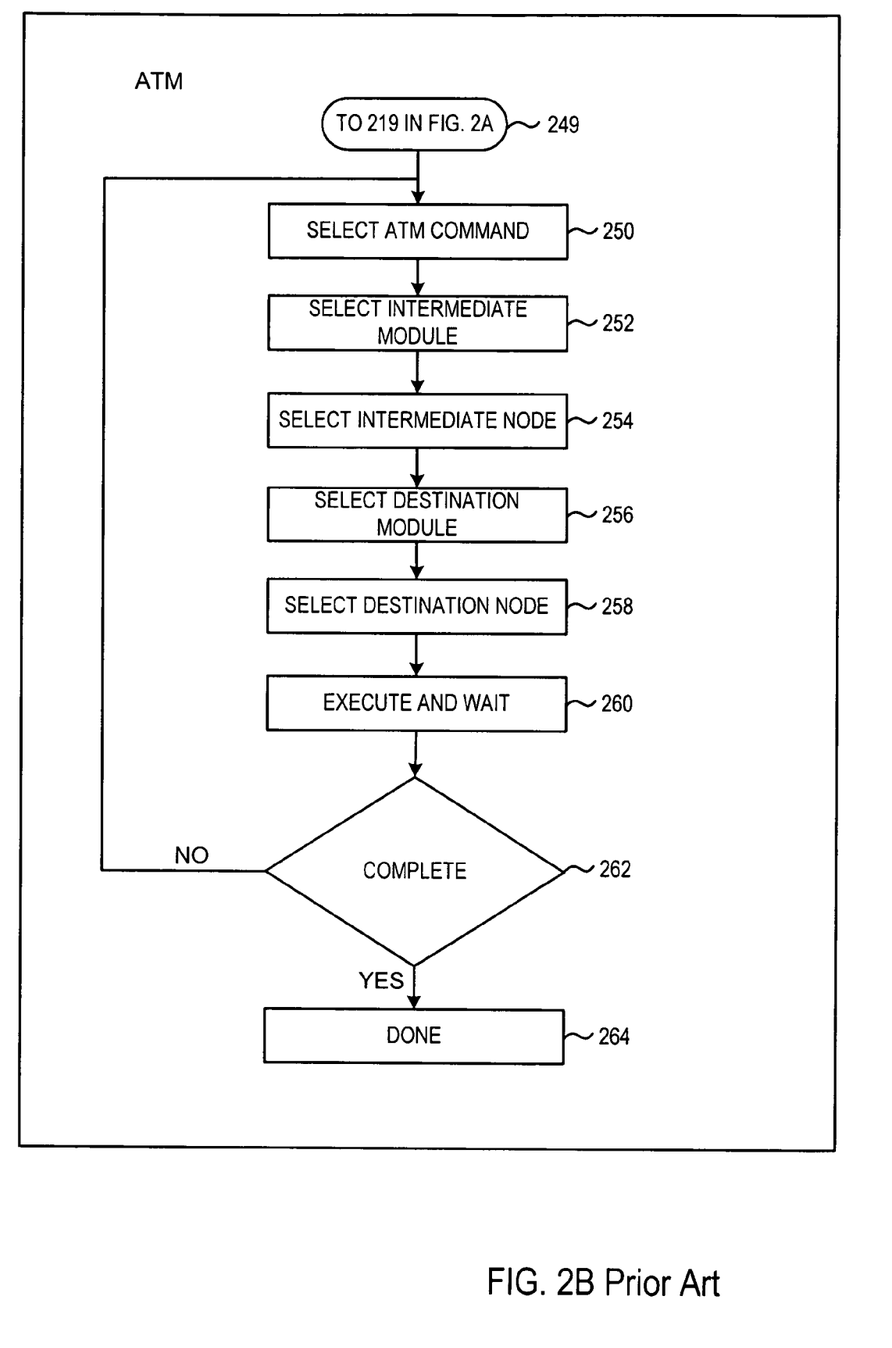
FIG. 2B shows a flowchart of the steps a user may take in order to move a wafer to a desired wafer-holding location in a atmospheric transfer module.

FIG. 2A and FIG. 2B both provide flowcharts of the steps a user may take in order to move a wafer to a desired wafer-holding location. FIGS. 2A and 2B are described in reference to FIG. 1 with the assumption that a user wants to move a wafer from PM 102 to port 110. FIG. 2A describes the steps a user takes in VTM commands 171 and FIG. 2B describes the steps a user takes in ATM commands 173.

At step 204, the user selects VTM commands 171. At step 206, the user selects a source module (i.e., enter PM 102 as the parameter for field 120). Then at step 208, the user selects a source node (i.e., enter 1 in field 122). At step 210, the user selects an intermediate destination module (i.e., enter airlock module 123 in field 124). Step 212 requires the user to select an intermediate destination node (i.e., enter 2 in field 126). At step 214, the user selects a robot effector (i.e., choose robotic arm A in field 136). At step 216, the user executes and waits for the wafer transfer instructions to be completed. At step 218, if the wafer is not at an intermediate destination wafer-holding location, then the process may start again at step 206 if the user wants to create another wafer transfer instructions.

However, if at step 218, the wafer is at an intermediate destination module, then the user proceeds to step 250. At step 250, the user selects ATM commands 173. At step 252, the user selects an intermediate source module (i.e., enter airlock module 123 in field 152). Then the user selects an intermediate source node (i.e., enter 2 in field 154). Parameters for steps 252 and 254 may be the same as those in steps 210 and 212 respectively. At step 256, the user selects a destination module (i.e., enter port 110 in field 156). Then, at step 258, the user selects a destination node (i.e., enter 1 in field 158). At step 260, the user executes by pushing button 174.

At step 260, if the wafer movement is complete (step 262), then the user proceeds to step 264 and the whole process is done. However, if the wafer movement is not complete, then the user returns to step 250 and proceeds to go through the steps again until the wafer is at its final destination wafer-holding location.

As described above, to move a wafer from a module to a port involves multiple wafer transfer instructions, which require a user to make multiple inputs. The user is not just required to define an origination wafer-holding location and a destination wafer-holding location, but the user may also have to select the mechanism by which the transfer is to be accomplished. As a result, the user needs to be knowledgeable in order to assure that the creation of wafer transfer instructions ensures a successful wafer movement.

There are several problems with the current methods for wafer movements. One, to create wafer transfer instructions requires a user to enter specific parameters. Thus, the user not only needs to know an origination wafer-holding location and a destination wafer-holding location, but the user may also have to define the transfer mechanism and an intermediate destination wafer-holding location. Since the user has to enter various parameters to create wafer transfer instructions, the possibility of errors increases.

Second, the user is limited by a graphical overview that may provide the user with the current state of a plasma cluster tool. Assume that a wafer currently occupies one of the wafer-holding locations in the plasma cluster tool (i.e., user sees that airlock module 121 is occupied by a wafer). However, the graphical overview may only allow the user to see that a module is occupied and does not identify which node is occupied (i.e., user is unable to determine whether the wafer is in node 1 or node 2). To prevent the risk of the two wafers being broken when one wafer tries to move into an occupied node, a skilled user may have to eliminate the possibility of using the occupied airlock module (i.e., 121) as the next wafer-holding location and chose another airlock module instead. However, if the user chooses to place a wafer into the occupied node, then two wafers will be broken and the plasma cluster tool will have to be shut down in order to clean the broken pieces from the wafer-holding location.

A third problem that exists occurs when an emergency arises and a plurality of wafers has to be removed in a timely manner. For example, a power outage occurs and the user is informed that he has five minutes to remove all wafers from a plasma cluster tool. The user has the option of physically removing the wafers from the plasma cluster tool or to create wafer transfer instructions to remove each wafer from the plasma cluster tool. In either case, the user runs the risk of making a mistake and causing damages to the machine as he quickly tries to remove the wafers from the plasma cluster tool within a short time span.

SUMMARY OF INVENTION

The invention relates, in an embodiment, to a computer-implemented method for creating a set of wafer transfer instructions configured to transfer a wafer between an origination wafer-holding location and a destination wafer-holding location in a plasma cluster tool, which has a plurality of wafer-holding locations. The method includes receiving a first user-provided location indicator, which graphically identifies the origination wafer-holding location on an on-screen graphical representation of the plasma cluster tool. The method also includes receiving a second user-provided location indicator, which graphically identifies the destination wafer-holding location on the on-screen graphical representation of the plasma cluster tool. The method further includes ascertaining data pertaining to a path between the first user-provided location indicator and the second user-provided location indicator. The method yet further includes forming the set of wafer transfer instructions responsive to the data pertaining to the path. The set of wafer transfer instructions is configured to transfer the wafer along a set of wafer-holding locations associated with the path.

In yet another embodiment, the invention relates to a computer-implemented method for creating a set of wafer transfer instructions configured to transfer a wafer between an origination wafer-holding location and a destination wafer-holding location in a plasma cluster tool, which has a plurality of wafer-holding locations. The method includes receiving a first user-provided location indicator, which identifies the origination wafer-holding location on an on-screen graphical representation of the plasma cluster tool. The method also includes receiving a second user-provided location indicator, which graphically identifies the destination wafer-holding location on the on-screen graphical representation of the plasma cluster tool. The method further includes ascertaining data pertaining to a path between the first user-provided location indicator and the second user-provided location indicator. The path traverses at least one other wafer-holding location other than the origination wafer-holding location and the destination wafer-holding location. Also, the path includes identities of wafer-holding locations between the origination wafer-holding location and the destination wafer-holding locations. The method yet further includes forming the set of wafer transfer instructions responsive to the data pertaining to the path. The set of wafer transfer instructions is configured to transfer the wafer along the wafer-holding locations associated with the path.

In yet another embodiment, the invention relates to a computer-implemented method for creating a set of wafer transfer instructions configured to transfer a wafer between an origination wafer-holding location and a destination wafer-holding location in a plasma cluster tool, which has a plurality of wafer-holding locations. The method includes ascertaining the origination wafer-holding location. The method also includes ascertaining the destination wafer-holding location. The method further includes automatically ascertaining data pertaining to a path between the origination wafer-holding location and the destination wafer-holding location. The path traverses at least one other wafer-holding location other than the origination wafer-holding location and the destination wafer-holding location. The path also includes identities of wafer-holding locations between the origination wafer-holding location and the destination wafer-holding locations. The method yet further includes automatically forming the set of wafer transfer instructions responsive to the data pertaining to the path. The set of wafer transfer instructions is configured to transfer the wafer along the wafer-holding locations associated with the path.

In yet another embodiment, the invention relates to an arrangement for creating a set of wafer transfer instructions configured to transfer a wafer between an origination wafer-holding location and a destination wafer-holding location in a plasma cluster tool, which has a plurality of wafer-holding locations. The arrangement includes means for receiving a first user-provided location indicator and a second user-provided location indicator. The first user-provided location indicator graphically identifies the origination wafer-holding location on an on-screen graphical representation of the plasma cluster tool. The second user-provided location indicator graphically identifies the destination wafer-holding location on the on-screen graphical representation of the plasma cluster tool. The arrangement also includes means for ascertaining data pertaining to a path between the first user-provided location indicator and the second user-provided location indicator. The arrangement further includes means for forming the set of wafer transfer instructions responsive to the data pertaining to the path. The set of wafer transfer instructions is configured to transfer the wafer along a set of wafer-holding locations associated with the path.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the present invention, there are provided computer-implemented methods for creating a set of wafer transfer instructions (i.e., macros) to transfer a wafer between an origination wafer-holding location and a destination wafer-holding location located in a plasma cluster tool that require minimal inputs from a user. As discussed herein, a plasma cluster tool may have a plurality of wafer-holding locations.

In an embodiment, a user identifies an origination wafer-holding location and a destination wafer-holding location on an on-screen graphical representation of a plasma cluster tool, and the system automatically generates a set of wafer transfer instructions that enable a successful wafer movement. One method for accomplishing this wafer movement is by using a drag-and-drop methodology. For example, the user provides a first user-provided location indicator by moving a mouse pointer over a wafer at an origination wafer-holding location. A second user-provided indicator is identified by dragging the wafer to a destination wafer-holding location and dropping the wafer on-screen. In another embodiment, the user provides the first user-provided location indicator and the second user-provided location indicator by typing in two fields on-screen the origination wafer-holding location and the destination wafer-holding location, respectively.

Regardless of the methodology that may be used to enable wafer movement, an embodiment of the invention may require a user to provide two inputs, an origination wafer-holding location and a destination wafer-holding location, to create a set of wafer transfer instructions including all intermediate wafer transfer instructions. The user no longer has to provide additional data (i.e., a mechanism by which the wafer is transferred or an intermediate destination wafer-holding location that the wafer may have to go through before the wafer reaches the destination wafer-holding location) needed to create a complete set of wafer transfer instructions. Instead, the system is able to determine the data pertaining to the path between the first user-provided location indicator and the second user-provided location indicator, and create a set of wafer transfer instructions that is responsive to the data and able to transfer the wafer along the path to the destination wafer-holding location.

Figure 3:
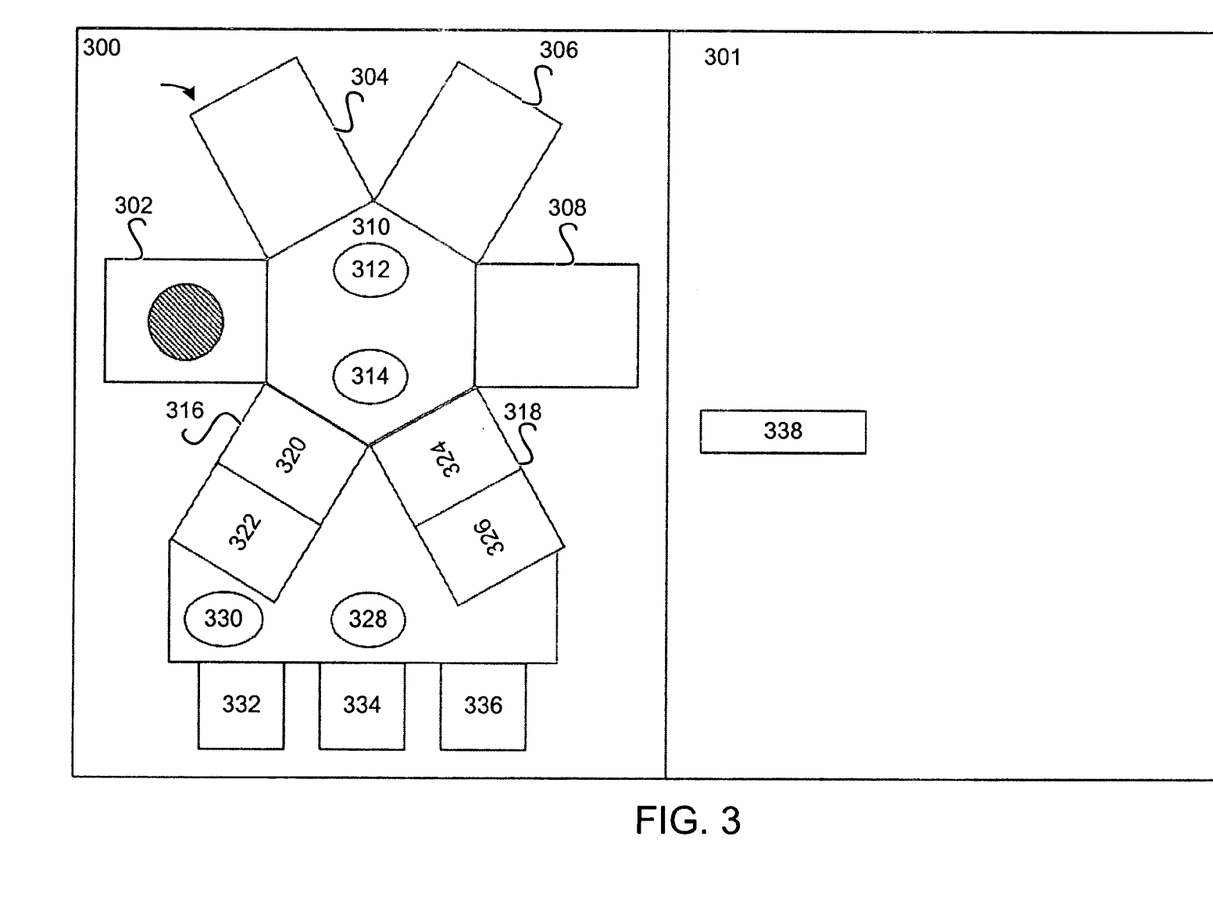
FIG. 3 shows, in an embodiment of the invention, an on-screen graphical representation of a plasma cluster tool.

The features and advantages of the present invention may be better understood with reference to the figures and discussions that follow. FIG. 3 shows an on-screen graphical representation of a plasma cluster tool. Unlike the prior art, section 300 is both an overview of the machine state and the interface to build wafer transfer instructions. Section 301 main function is to provide mostly status data about the various modules and nodes.

In an embodiment, section 300 is an animated graphical overview of the plasma cluster tool. In this diagram, the plasma cluster tool has four process modules (302, 304, 306, and 308). The plasma cluster tool also includes a vacuum transfer module 310 with two robotic effectors (312 and 314). Also shown are two airlock modules (316 and 318) with two nodes in each module (320, 322, 324, and 326), an atmospheric transfer module 328, an aligner 330, and three ports (332, 334, and 336).

For example, a user wants to move a wafer from process module (PM) 302 to port 332. The user may only have to identify an origination wafer-holding location, which is PM 302, and a destination wafer-holding location, which is port 332. With the origination wafer-holding location and the destination wafer-holding location, the system is able to generate wafer transfer instructions to complete the wafer movement. The data related to the creation of a set of wafer transfer instructions are provided by the system on section 301, in an embodiment.

Figure 4:
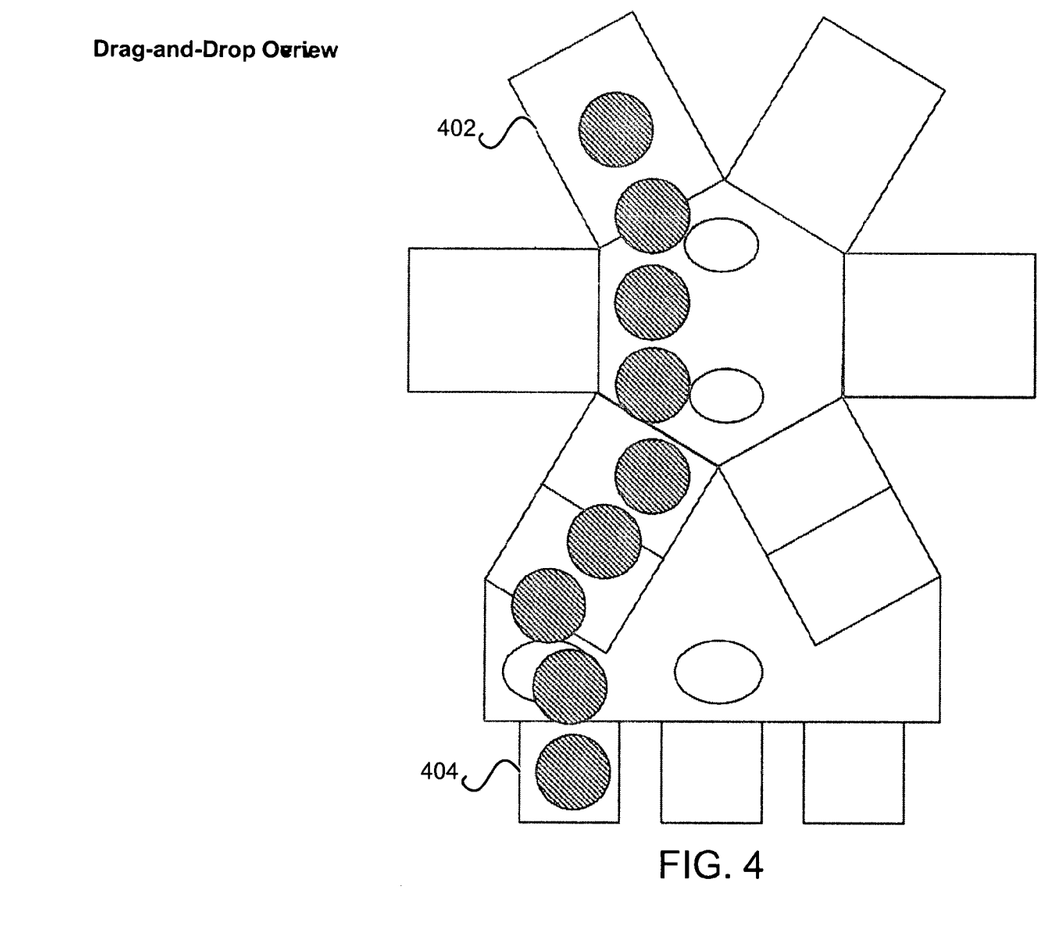
FIG. 4 shows, in an embodiment of the invention, how a wafer may be moved using a drag-and-drop method to accomplish the wafer movement.

FIG. 4 shows, in an embodiment, how a wafer may be moved using a drag-and-drop method to accomplish the wafer movement. In this diagram, PM 402 equates to PM 302 in FIG. 3 and port 404 equates to port 332 in FIG. 3. The user provides a first user-provided location indicator by placing a mouse pointer over an origination wafer-holding location (i.e., PM 402) and identifies a second user-provided location indicator by dragging the wafer to a destination wafer-holding location (i.e., port 404) and dropping the wafer at the destination wafer-holding location. The dragging path may vary from that shown in FIG. 4; as long as the origination wafer-holding location and the destination wafer-holding location are provided, the system can fill in the intermediate locations if needed.

In another embodiment, a user may type, in two fields on an on-screen animated graphical overview, a first user-provided location indicator to indicate an origination wafer-holding location (i.e., PM 402) and a second user-provided location indicator to indicate a destination wafer-holding location (i.e., PM 404). Regardless of the method used, the system may only need the origination wafer-holding location and the destination wafer-holding location to create a set of wafer transfer instructions to accomplish the wafer movement.

To generate a set of wafer transfer instructions, the system evaluates each candidate node to determine its availability and acceptability to create the shortest path to move a wafer from its origination wafer-holding location to its destination wafer-holding location. As discussed herein, a node is available if it is not currently occupied. Acceptability relates to whether or not a node may have a problem accepting a wafer for transfer. If the candidate node is not available or not acceptable, the system flags the candidate node as excludable and the candidate node is not included in a list of nodes the system uses to create the path for the wafer movement.

There are various algorithms that may be utilized to create a set of wafer transfer instructions. In an embodiment of the invention, a breadth-first traversal algorithm is used. The breadth-first traversal algorithm that is used meets two conditions. First, the breadth-first traversal algorithm has to return an optimal state (i.e., breadth-first traversal algorithm has to return the optimal path). Second, the breadth-first traversal algorithm has to be complete (i.e., breadth-first algorithm has to do a thorough search).

With the breadth-first traversal algorithm, if there are three equal-length paths, then the breadth-first traversal algorithm returns the first path it encounters. Likewise, if there are three different paths, then the breadth-first traversal algorithm returns the shortest path.

Figure 5A:
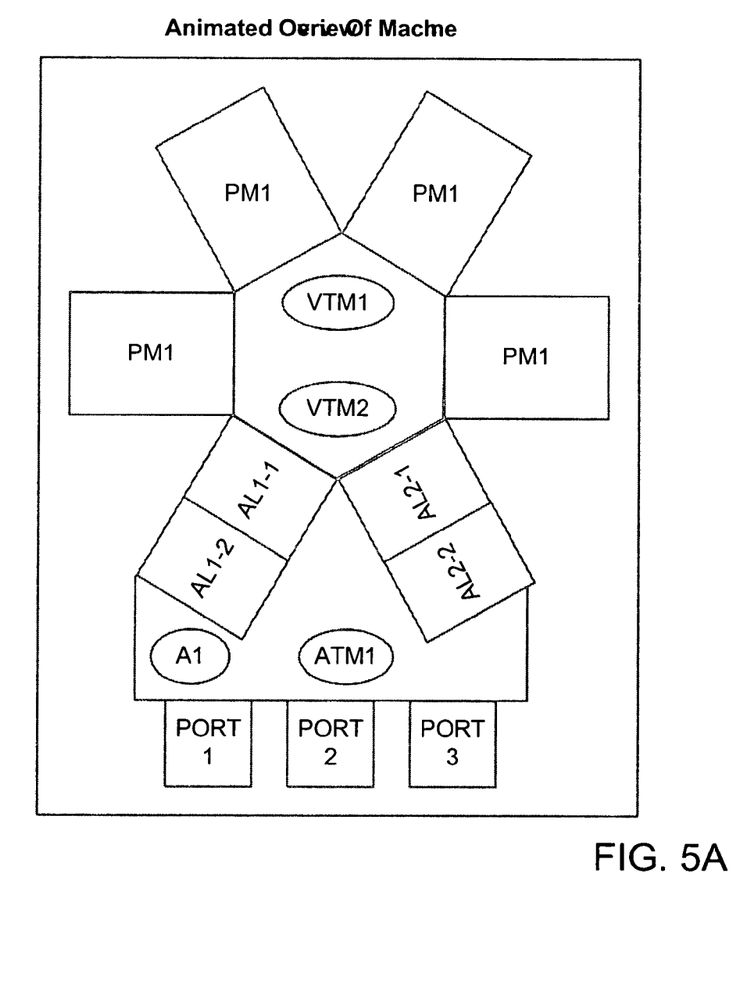
FIG. 5A shows, in an embodiment of the invention, a plasma cluster tool with its various modules.

The next few diagrams show how breadth-first traversal algorithm may be used to create a set of wafer instructions. FIG. 5A shows a plasma cluster tool with process modules (PM1, PM2, PM3, and PM4), a vacuum transfer module with two robotic effectors (VTM1 and VTM2), two airlock modules (AL-1 and AL-2) which may contain 2 nodes each (AL1-1, AL1-2, AL2-1, and AL2-2), an atmospheric transfer module (ATM1), an aligner (A1) and multiple ports (Port 1, Port 2, and Port 3).

Figure 5B:
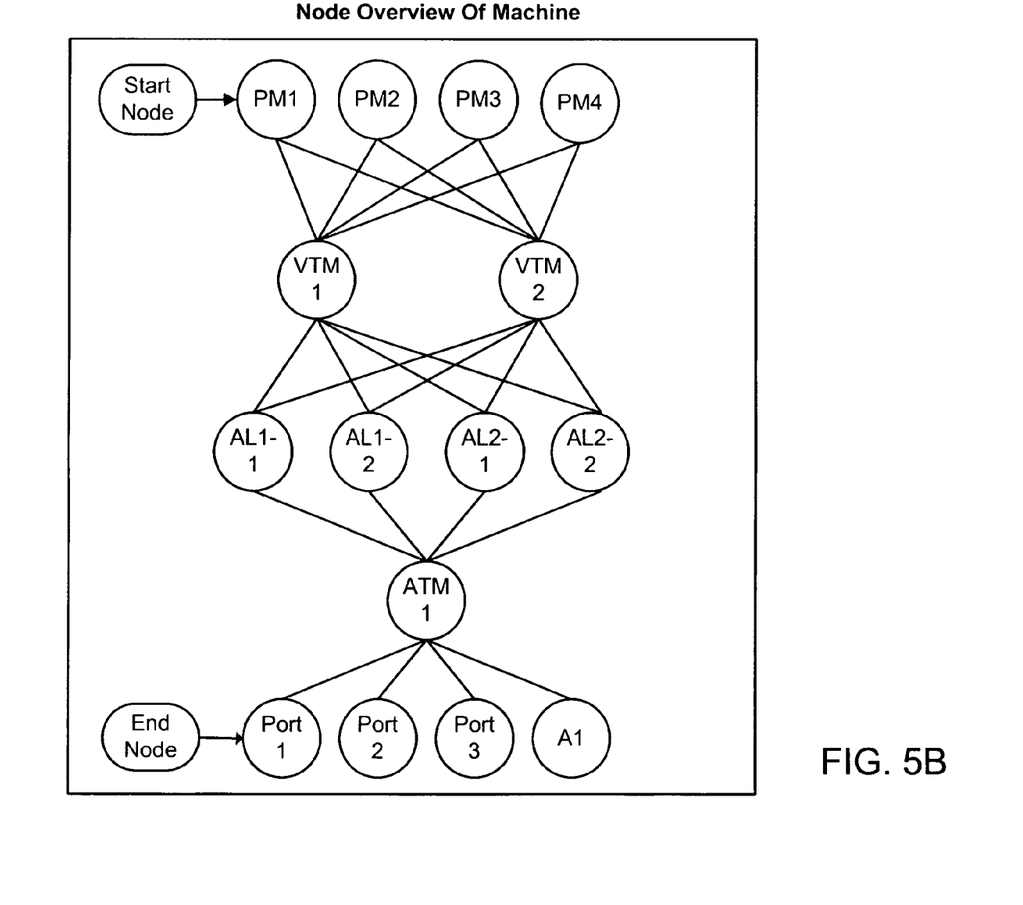
FIG. 5B shows, in an embodiment of the invention, a node overview of the plasma cluster tool shown in FIG. 5A.

FIG. 5B shows a node overview of the same plasma cluster tool. As discussed herein, a module may have more than one node. Since there is only one node for each process module, each process module is shown as having one node (PM1, PM2, PM3, and PM4). Likewise, a vacuum transfer module is shown as two nodes (VTM1 and VTM2), since there are two robotic effectors. The two airlock modules are shown with two nodes each (AL1-1, AL1-2, AL2-1, and A12-2). The atmospheric transfer module is shown with one node (ATM1) and the aligner (A1) and ports (Port 1, Port 2, Port 3 and Port 4) are shown as one node each.

Figure 6:
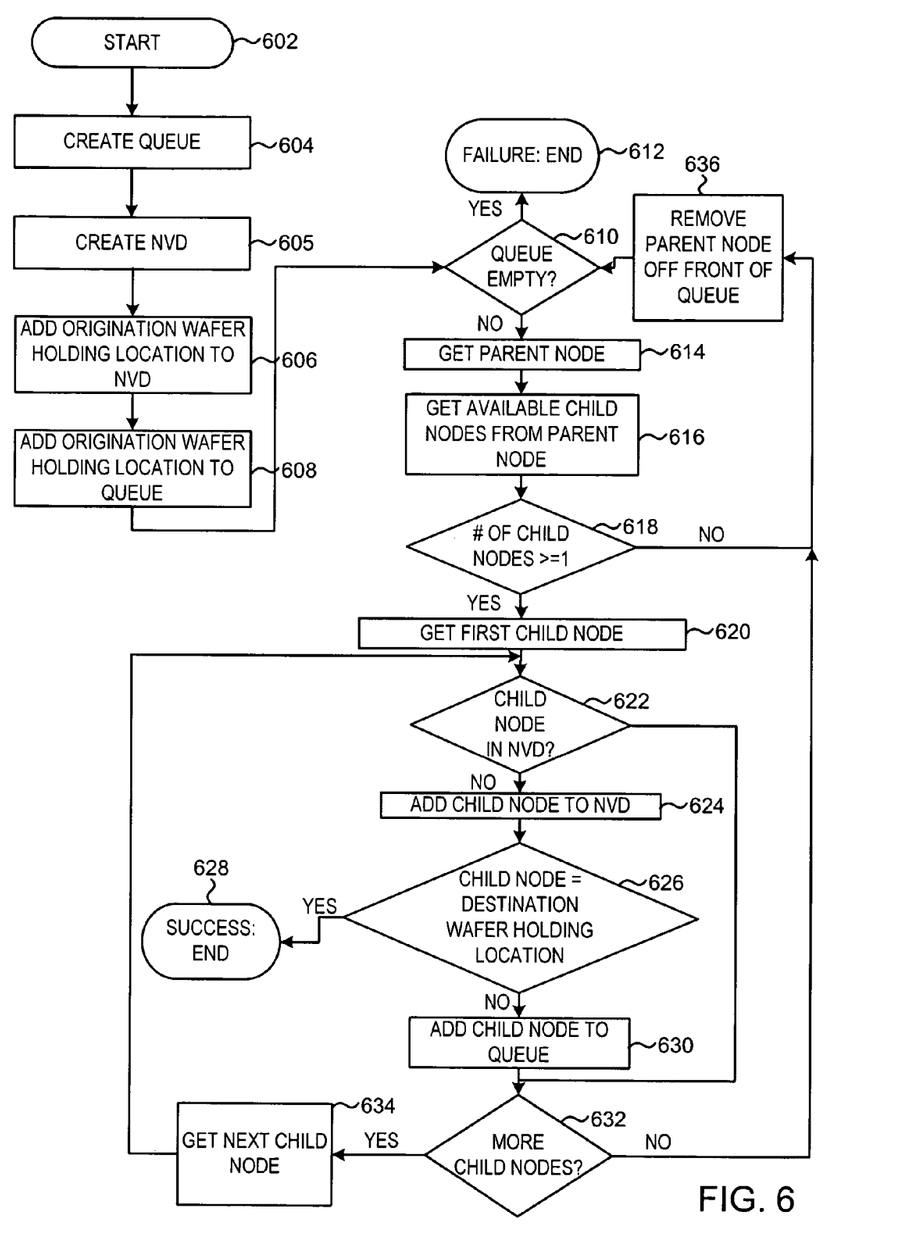
FIG. 6 shows, in an embodiment of the invention, a flowchart of a breadth-first traversal algorithm that may be used to create wafer transfer instructions as applied to FIGS. 5A and 5B.
Figure 7:
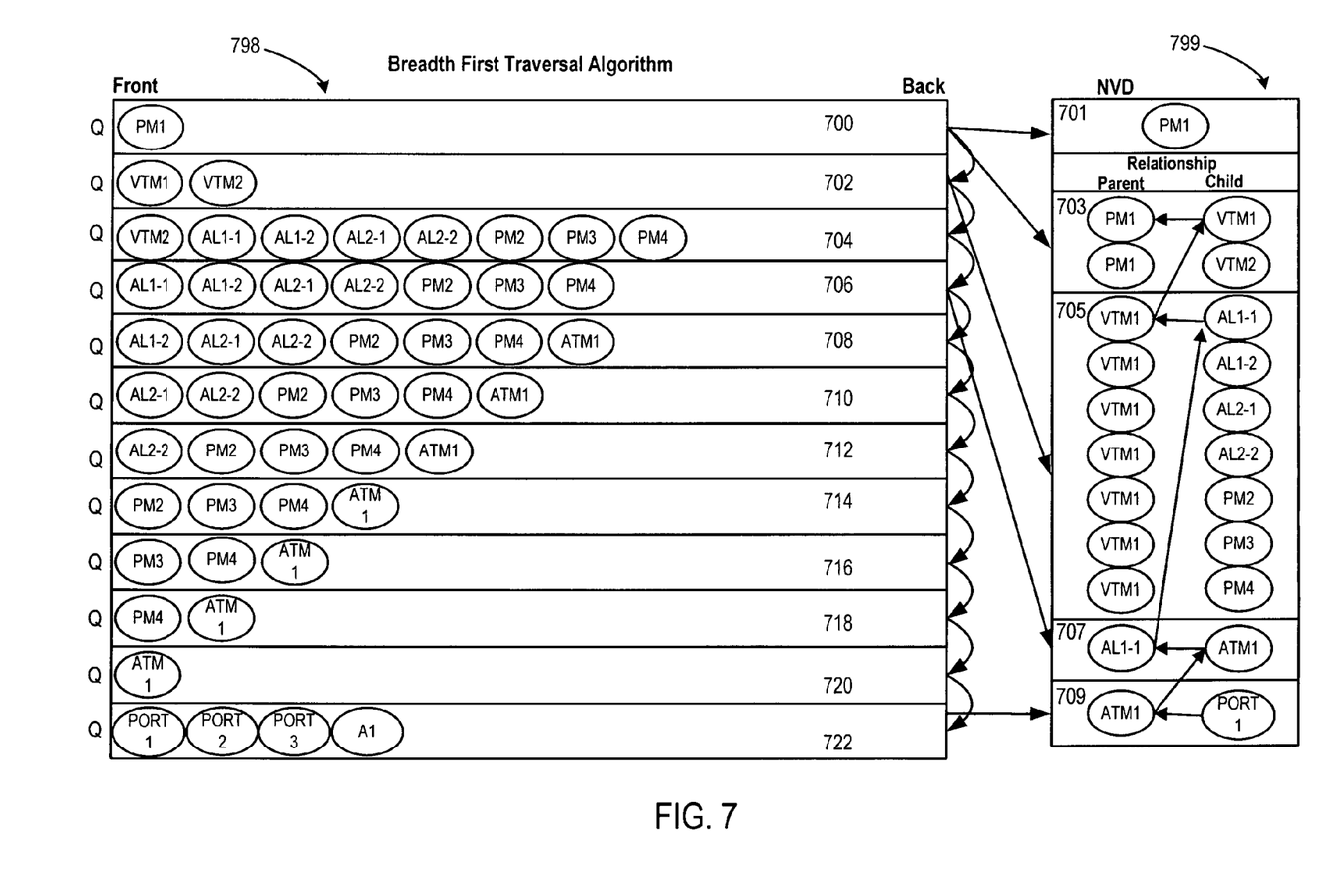
FIG. 7 shows, in an embodiment of the invention, a graphical diagram of the flowchart in FIG. 6 as applied to FIGS. 5A and 5B.

In addition to FIG. 5A and FIG. 5B, FIG. 6 and FIG. 7 further show how breadth-first traversal algorithm may be used to create wafer transfer instructions. FIG. 6 provides a flowchart that the breadth-first traversal algorithm may follow and FIG. 7 shows an example of a graphical diagram of the flowchart.

Assume that a user wants to move a wafer from PM1 to port 1. Once the user has dropped the wafer at port 1, the system begins a breadth-first traversal algorithm at step 602. At step 604, an empty queue is created. As discussed herein, a queue is an orderly method by which each candidate node may be examined to determine whether or not the candidate node is the destination wafer-holding location. The queue is a first-in-first-out type of queue (i.e., items are added at the back of the queue and taken out at the front of the queue).

At step 605, the node visit dictionary (NVD) is created. NVD is a variable that holds the nodes that are encountered when the system is evaluating each candidate node. The relationships between the nodes are also stored in the NVD.

At step 606, the origination wafer-holding location node (i.e., PM1) is added to the NVD. At step 608, the origination wafer-holding location node is added to the queue. As discussed herein, any node at the front of the queue is considered a parent node.

At step 610, if the queue is empty, then the process ends at step 612. The process ends at step 612 because no destination wafer-holding location node can be found and a set of wafer transfer instructions has not been created.

In this example, the queue is not empty so at step 614, the system grabs the front queue node. Using the front queue node, the system is able to identify all available child nodes (VTM1 and VTM2). If the child node is unavailable (i.e., the child node is occupied by another wafer) or unacceptable (i.e., the child node has an alarm condition) then the child node is eliminated as an available candidate node; thus, the child node is not added to the NVD or to the queue. As a result, that node is not considered in the creation of the set of wafer transfer instructions.

At step 618, the system checks to see if the number of child nodes is greater or equal to 1. If there is no child node, then the system proceeds to step 636 to remove the parent node from the front of the queue. At step 610, the queue is empty, so the system ends the process at step 612 and a set of wafer transfer instructions is not created.

However, in this example, the number of child nodes is greater than 1. The system proceeds to step 620 to get the first child node. At step 622, the child node is checked against the NVD to determine if the node is already in the dictionary. Since the child node is not yet in the NVD, the system proceeds to step 624 to add the child node to the NVD. In the case that the child node is already in the NVD, the child node is not added again to the NVD.

At step 626, the system checks to determine if the child node equals to destination wafer-holding location (Port 1). Since VTM1 is not the destination wafer-holding location, the system proceeds to step 630 to add the child node to the queue.

At step 632, the system checks to see if there is any additional child node. If there are additional child nodes then the system proceeds to step 634 to get the next child node and returns to step 622 to begin the process again until all child nodes of the current parent node have been added to the NVD. If at step 622, the child node is already in the NVD, then the system proceeds to step 632 to check for additional child nodes. Once all child nodes have been identified, the system proceeds to step 636 to remove the parent node off the front of the queue. From step 636, the system returns to step 610 to begin the process again until the destination wafer-holding location is reached.

FIG. 7 shows a graphical diagram of the breadth-first traversal algorithm flowchart as applied to the example plasma cluster tool of FIGS. 5A and 5B. Section 798 shows the queues and section 799 shows the NVD. The NVD 799 shows the origination wafer-holding location PM1 in block 701. In queue 700, PM1 is shown as the only node in the queue.

Below block 701 in the NVD, the parent-child relationships are stored. In block 703, PM1 is shown as the parent node with 2 child nodes (VTM1 and VTM2). In queue 702, VTM1 and VTM2 have been added to the back of the queue and PM1 has been dropped since it is not the destination wafer-holding location. VTM 1 is now the new parent node.

In block 705 of the NVD, VTM 1 is shown as the parent node and the airlock nodes (AL1-1, AL1-2, AL2-1, and AL2-2) and the other process modules (PM2, PM3, and PM4) are the child nodes. Corresponding, queue 704 shows the child nodes (AL1-1, AL1-2, AL2-1, AL2-2, PM2, PM3, and PM4) of VTM1 being added to the back of the queue and VTM1 being dropped since it is not the destination wafer-holding location.

VTM2 has now moved to the front of the queue and is considered as the new parent node. Since VTM2 has the same child nodes as VTM1, no new nodes are added to the NVD. Thus, no additional nodes will be added to queue 706 when VTM2 is dropped from the front of the queue and AL1-1 moves to the front of the queue and becomes the new parent node.

In section 707 of the NVD, AL1-1 is shown as the parent node. Only ATM1 is shown as the child node here since the other child node (i.e., VTM2) already exists in the NVD. Correspondingly, ATM1 is added to the back of queue 708 and AL1-1 is dropped from the queue since AL1-1 is not the destination wafer-holding location.

AL1-2 has now moved to the front of the queue and is considered as the new parent node. Since AL1-2 has the same child nodes as AL1-1, no new nodes are added to the NVD. Thus, no additional nodes will be added. Since AL1-2 is not the destination wafer-holding location, AL1-2 is dropped from the queue.

In queue 710, AL2-1 is the new parent node. However, since AL2-1 has the same child nodes as AL1-1, no new child node is added to the NVD or to the end of the queue. Since AL2-1 is not the destination wafer-holding location, AL2-1 is dropped from the queue.

In queue 712, AL2-2 is the new parent node. However, since AL2-1 has the same child nodes as AL1-1, no new child node is added to the NVD or to the end of the queue. Since AL2-2 is not the destination wafer-holding location, AL2-2 is dropped from the queue and PM2 is the new parent node at queue 714. Since, PM2 does not add any new child node to the NVD, no additional child node is added to the back of the queue. Since PM2 is not the destination wafer-holding location, PM2 is dropped from the queue.

At queue 716, PM3 is the new parent node. PM3 also does not add any new nodes, so no additional node is added to the NVD or the queue. At queue 718, PM3 is dropped from the queue and PM4 becomes the new parent node. Again, no new child node exists, so no additional nodes are added to the NVD or the queue. At queue 720, PM4 is dropped from the queue and ATM1 becomes the new parent node.

In section 709, ATM1 is shown as the parent node and Port 1, Port 2, Port 3 and A1 are shown as child nodes. Correspondingly, in queue 722, Port 1, Port 2, Port 3, and A1 have been added to the queue and ATM1 has been dropped from the queue since ATM1 is not the destination wafer-holding location. Port 1 is now the new parent node. Since port 1 is the destination wafer-holding location, the breadth-first traversal algorithm is completed and the wafer movement path can be determined to create the set of wafer transfer instructions.

Based on the NVD, Port 1 is a child of ATM1, which is a child of AL1-1. AL1-1 is a child of VTM1 and VTM1 is a child of PM1. Thus, the optimal and complete path in this example is PM1 to VTM1 to AL1-1 to ATM1 to Port1. This path is the set of wafer transfer instructions the system may use in this example to move the wafer from PM1 to Port 1.

As can be appreciated from the foregoing, embodiments of the invention allow for wafer transfer instructions to be created with only an origination wafer-holding location and a destination wafer-holding location identified. Given that a user does not have to provide additional parameters, the chance of the user making a mistake in creating wafer transfer instructions is substantially eliminated since the user is no longer providing the additional parameters needed to create intermediate wafer transfer instructions. Instead, the system is programmed to evaluate each candidate node to determine the best path to move the wafer.

Further, the number of broken wafers decreases since the system may be configured to determine acceptability and availability of each candidate node. For example, if a node is currently occupied by another wafer or the node has an alarm condition, then the system is able to evaluate the node status and eliminate the node as a viable candidate.

In an embodiment of the invention, the system provides for a wafer cleanout. In the past, if, for example, a blackout occurs and a user is given a short time to clean all wafers from a plasma cluster tool, the user has to create wafer transfer instructions for removing each wafer in the limited time given. In an embodiment of the invention, the user only has to provide a destination wafer-holding location (i.e., Port 1) and issue a wafer cleanout instruction (i.e., 338 of FIG. 3). The system has sensors to determine the current location of each wafer and hence the origination wafer-holding location of each wafer. Thus, the system is able to self-generate sets of wafer transfer instructions to move each wafer to the destination wafer-holding location. Since a port generally has a plurality of nodes, the system is able to deliver the wafer to each unoccupied node in the port without accidentally placing a wafer into an occupied node.

While this invention has been described in terms of several embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A computer-implemented method for creating a set of wafer transfer instructions configured to transfer a wafer between an origination wafer-holding location and a destination wafer-holding location in a plasma cluster tool, said plasma cluster tool having a plurality of wafer-holding locations, said method comprising:
    receiving a first user-provided location indicator, said first user-provided location indicator graphically identifying said origination wafer-holding location on an on-screen graphical representation of said plasma cluster tool;
    receiving a second user-provided location indicator, said second user-provided location indicator graphically identifying said destination wafer-holding location on said on-screen graphical representation of said plasma cluster tool;
    ascertaining data pertaining to a path between said first user-provided location indicator and said second user-provided location indicator;
    using a sensor associated with a first wafer-holding location to report said first-wafer holding location as unsuitable for accepting said wafer;
    flagging at least said first wafer-holding location of said plasma cluster tool as being excludable;
    excluding said first wafer-holding location from a list of nodes used for forming said path; and
    forming said set of wafer transfer instructions responsive to said data pertaining to said path, said set of wafer transfer instructions being configured to transfer said wafer along a set of wafer-holding locations associated with said path.

2. The method of claim 1 wherein said first user-provided location indicator and said second user-provided location indicator are indicated by a user using a drag-and-drop operation on said graphical representation of said plasma cluster tool.

3. The method of claim 1 wherein said ascertaining said data pertaining to said path employs a "breadth-first" traversal algorithm.

4. The method of claim 1 wherein said set of wafer transfer instructions represents a set of macros.

5. The method of claim 1 further comprising:
    determining whether said first wafer-holding location is able to accept said wafer; and
    performing said flagging based on said determining.

6. The method of claim 1 wherein said first wafer-holding location represents a given node of a given module in said plasma cluster tool.

7. A computer-implemented method for creating a set of wafer transfer instructions configured to transfer a wafer between an origination wafer-holding location and a destination wafer-holding location in a plasma cluster tool, said plasma cluster tool having a plurality of wafer-holding locations, said method comprising:
    receiving a first user-provided location indicator, said first user-provided location indicator graphically identifying said origination wafer-holding location on an on-screen graphical representation of said plasma cluster tool;
    receiving a second user-provided location indicator, said second user-provided location indicator graphically identifying said destination wafer-holding location on said on-screen graphical representation of said plasma cluster tool;
    ascertaining data pertaining to a path between said first user-provided location indicator and said second user-provided location indicator, said path traversing at least one other wafer-holding location other than said origination wafer-holding location and said destination wafer-holding location, said path including identities of wafer-holding locations between said origination wafer-holding location and said destination wafer-holding locations;
    using a sensor associated with a first wafer-holding location to report said first-wafer holding location as unsuitable for accepting said wafer;
    flagging at least said first wafer-holding location of said plasma cluster tool as being excludable;
    excluding said first wafer-holding location from a list of nodes used for forming said path; and
    forming said set of wafer transfer instructions responsive to said data pertaining to said path, said set of wafer transfer instructions being configured to transfer said wafer along said wafer-holding locations associated with said path.

8. The method of claim 7 wherein said first user-provided location indicator and said second user-provided location indicator are indicated by a user using a drag-and-drop operation on said graphical representation of said plasma cluster tool.

9. The method of claim 7 wherein said ascertaining said data pertaining to said path employs a "breadth-first" traversal algorithm.

10. The method of claim 7 wherein said set of wafer transfer instructions represents a set of macros.

11. The method of claim 7 further comprising:
    determining whether said first wafer-holding location is able to accept said wafer; and
    performing said flagging based on said determining.

12. The method of claim 7 wherein said first wafer-holding location represents a given node of a given module in said plasma cluster tool.

13. A computer-implemented method for creating a set of wafer transfer instructions configured to transfer a wafer between an origination wafer-holding location and a destination wafer-holding location in a plasma cluster tool, said plasma cluster tool having a plurality of wafer-holding locations, said method comprising:

ascertaining said origination wafer-holding location;

ascertaining said destination wafer-holding location;

automatically ascertaining data pertaining to a path between said origination wafer-holding location and said destination wafer-holding location, said path traversing at least one other wafer-holding location other than said origination wafer-holding location and said destination wafer-holding location, said path including identities of wafer-holding locations between said origination wafer-holding location and said destination wafer-holding locations;

using a sensor associated with a first wafer-holding location to report said first-wafer holding location as unsuitable for accepting said wafer;

flagging at least said first wafer-holding location of said plasma cluster tool as being excludable;

excluding said first wafer-holding location from list of nodes used for forming said path; and automatically forming said set of wafer transfer instructions responsive to said data pertaining to said path, said set of wafer transfer instructions being configured to transfer said wafer along said wafer-holding locations associated with said path.

14. The method of claim 13 wherein said ascertaining said data pertaining to said path employs a "breadth-first" traversal algorithm.

15. The method of claim 13 wherein said set of wafer transfer instructions represents a set of macros.

16. The method of claim 13 further comprising:

determining whether said first wafer-holding location is able to accept said wafer; and performing said flagging based on said determining.

17. The method of claim 13 wherein said set of wafer transfer instructions is configured to evacuate wafers from said plasma cluster tool, said ascertaining said origination wafer-holding location including obtaining sensor data identifying the current location of a first wafer, ascertaining said destination wafer-holding location including designating an output port associated with said plasma cluster tool.

* * * * *